FOUR TERMINAL ELECTRO-OPTICAL LOGIC DEVICE

Filed Dec. 30, 1963 2 Sheets-Sheet 1

INVENTORS.
IVARS G. AKMENKALNS
RAYMOND J. WILFINGER
ALAN D. WILSON
BY Ronald J. Clark
AGENT Dec. 17, 1968 I. G. AKMENKALNS ET AL 3,417,249

FOUR TERMINAL ELECTRO-OPTICAL LOGIC DEVICE

Filed Dec. 30, 1963 2 Sheets-Sheet 2

3,417,249
FOUR TERMINAL ELECTRO-OPTICAL LOGIC DEVICE

Ivars G. Akmenkalns, Endicott, Raymond J. Wilfinger, Poughkeepsie, and Alan D. Wilson, Endicott, N.Y., assignors to International Business Machines Corporation, New York, N.Y., a corporation of New York
Filed Dec. 30, 1963, Ser. No. 334,419
5 Claims. (Cl. 250—217)

ABSTRACT OF THE DISCLOSURE

This invention is directed to a light operated switch wherein the input circuit is electrically isolated from the output circuit. The input circuit comprises a GaAs diode radiating photons in an energy band or radiation photons within a frequency spectrum. Said energy band or frequency spectrum overlapping with the energy absorption band or absorption frequency spectrum of a silicon transistor which comprises the output circuit.

This invention relates to electro-optical devices and, more particularly to an electro-optical device employing a light emitting diode for exciting a transistor detector.

An electro-optical device has the characteristic of being a four terminal network. That is, the input signal may be referenced to one voltage control level, and the output circuit is referenced to a separate voltage level to prevent current coupling from one circuit to the other. Therefore, a complete electrical isolation is achieved between the two circuits. Such isolation is desirable in logic circuits which simulate the operation of a relay circuit, because it improves the power efficiency of the circuit and gives design flexibility.

The use of a diode as the source of light has the advantage of being in the same space domain as the transistor with which it is expected to operate. Therefore, the diode can be placed in proximity to the area of the transistor which is influenced by its light emitting characteristic. Additionally, the diode experiences negligible heat generation while performing its light generating function. This absence of heat is favorable because an excess amount of heat would affect the operation of its associated transistor.

The diode emits radiation in a narrow energy band which is characterized by the energy gap of the diode material used. Additionally, the transistor detector responds to energy in a narrow band, and it is matched with a particular diode to provide a combination having overlapping or interlocking energy bands. This matching need not be more than selecting the type of materials from which each element is constructed and does not mean that hand selection or testing techniques must be employed to select two compatible components. Therefore, since the radiation energy band or radiation frequency spectrum of the diode lies within the absorption energy band or absorption frequency spectrum of the transistor, the maximum use of light energy is achieved.

The light emission characteristics of the diode can be improved by employing a curvilinear N-type portion. This portion can be in a semi-spherical or a parabolic configuration. Also, a reflecting layer may be placed above this curvilinear surface to reduce the amount of light escaping from the emitting junction and to divert it back onto the sensitive area of the associated transistor. It must be borne in mind that the reflectivity of all intervening mediums must be matched to assure maximum transfer of light across the interface.

Complete electrical isolation of the excitation medium from the detection medium is obtained by placing a silicon oxide or glass layer between the diode junction and the base region of the associated transistor detector. Either of the layers is optically transparent to the light emission spectrum of the diode and is electrically insulating to the currents used in the input circuit. Rugged construction and optimum light transfer is achieved by bonding the diode, glass, and transistor junctions together to secure physical proximity.

Accordingly, it is a principal object of the present invention to provide a four terminal device having complete electrical isolation between its input and output circuits.

It is another object of the invention to provide a device employing a diode radiation source and a transistor detection element.

It is a further object of the invention to provide a device employing a diode which emits light when forward biased.

It is a still further object of the invention to provide a device employing a diode emission source and a transistor detection element having overlapping energy bands.

The foregoing and other objects, features and advantages of the invention will be apparent from the following more particular description of preferred embodiments of the invention, as illustrated in the accompanying drawings.

Briefly this invention consists of a light emitting diode used to excite a transistor. The diode and transistor are combined into a single integrated device to optimize the light transmission from the diode to the transistor.

Figure 1:
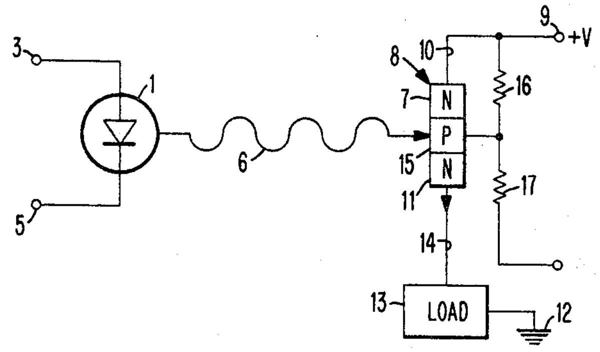
FIG. 1 is a schematic diagram of the instant invention shown with its biasing resistors.
Figure 4:
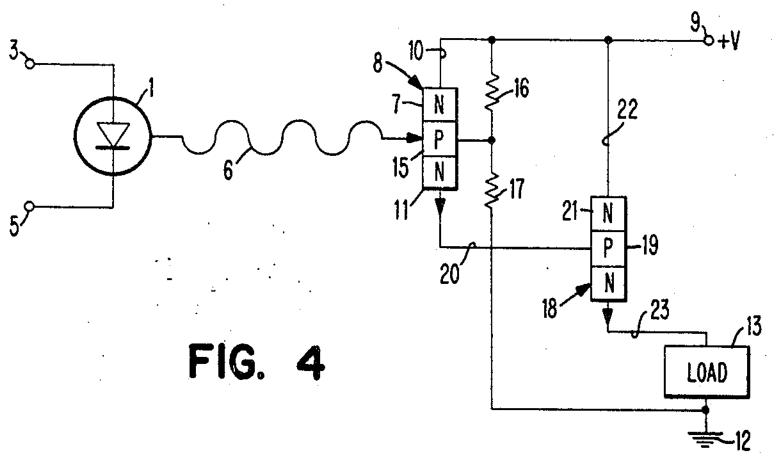
FIG. 4 is a schematic view of the instant invention when incorporating an additional integral transistor.

Referring to FIGS. 1 and 4, there can be seen a diode 1 connected between a pair of input terminals 3 and 5. A forward biasing signal is applied to the diode 1 by means of the terminals 3 and 5, which signal creates a light emission signal schematically represented by a line 6. The collector portion 7 of a transistor 8 is connected to a source of positive potential 9 by a collector lead 10, and the emitter portion 11 of the transistor 8 is connected to ground 12 by means of a series connected load 13 and an emitter lead 14. The light from the diode 1 irradiates the base portion 15 of the transistor 8 with photons possessing a certain energy level. The transistor 8 has an energy band absorption level which corresponds to the energy band of the photons, and carriers within the base region are activated by the incident light. These carriers are analogous to a base current, normally induced by a forward biasing base voltage, and cause a collector-emitter current to flow in the collector lead 10 and the emitter lead 14 of the transistor 8 and through the series connected load 13. Resistors 16 and 17 perform the biasing arrangement generally employed with normal transistor design techniques. However, these resistors are not required if the transistor utilized has a sufficiently low collector to emitter leakage current under normally applied voltage potentials. This leakage current must be so minor as to assure that the transistor remains nonconducting without a base input signal. The output of the transistor 8 may be employed to drive directly the load 13 or it may be amplified in a second transistor 18.

Whenever the second transistor 18 is employed, the emitter portion 11 of the transistor 8 is connected to the base portion 19 of the transistor 18 by line 20. Additionally, the collector portion 21 of the transistor 18 is connected to the source of positive potential 9 by a line 22, and the load 13 is placed between the emitter lead 23 of the transistor 18 and ground 12.

Figure 2:
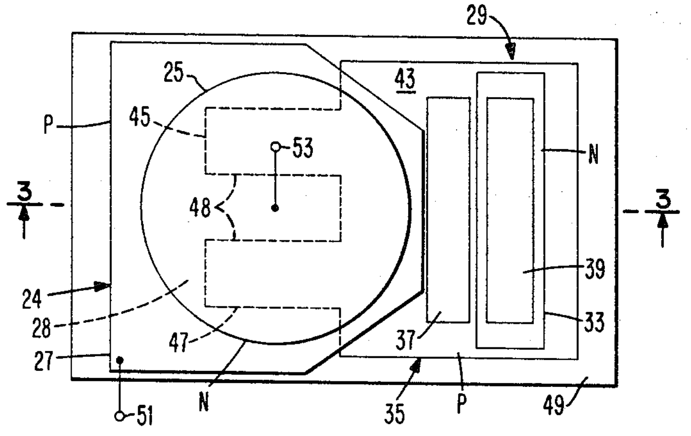
FIG. 2 is the plan view of the instant invention as presented as an integrated circuit.
Figure 3:
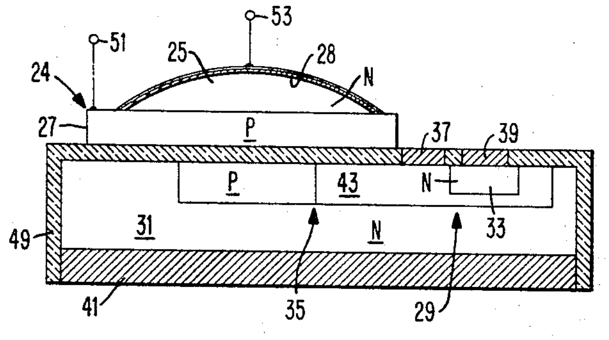
FIG. 3 is a section taken along line 3—3 in FIG. 2.

An integrated embodiment of an electro-optical device constructed according to the instant invention is shown in FIGS. 2 and 3, and includes a diode as generally indicated at 24. The diode has an N-type portion 25 which may be spherically or parabolically shaped and a P-type portion 27. The N-type portion is covered with an optically reflecting surface 28. The light produced by the diode 24 is generated in the P-type portion just inside the P-N junction upon the application of a forward biasing current across the diode. Suitable N-type, and P-type material is that identified as gallium arsenide, gallium phosphide, gallium telluride or silicon carbide.

An integrated transistor is indicated generally at 29 having a collector portion 31, an emitter portion 33, a base portion 35 and a plurality of bonded electrical contacts 37, 39 and 41.

The base portion 35 consists of a generally square segment 43 and two integral rectangular portions 45 and 47 which extend under the diode 24 thereby giving a prolongated P-N junction, indicated by the dotted line 48, which junction line is exposed to the light generated in the diode 24. The diode 24 is electrically separated from the transistor 29 by a layer of optically transparent silicon oxide 49. This oxide provides a protecting layer over the transistor in addition to its other purposes. The input to the device is by means of a pair of input terminals 51 and 53, and the output from the device is taken across the collector and emitter contacts 39 and 41.

A suitable transistor for operation in the described embodiment of the instant invention is that identified as being made of silicon. The instant invention will operate whether constructed with NPN transistors as shown or with PNP transistors. Additionally, the P side or the N side of the light emitting diode may be positioned in proximity to the base of its associated transistor.

In operation an input signal sufficient to forward bias the diode 24 is applied by means of the terminals 51 and 53. Light is generated in the P-region 27 of the diode just inside the P-N junction and is radiated in all directions. A portion of the light passes directly through the silicon oxide layer 49 and strikes the base region 35 and the P-N junction 48 of the transistor 29. Another portion of the light passes through the N-type region 25 of the diode 24 and is reflected back onto the base 35 by the reflecting surface 28. The light incident upon the base area 35 sets up a charge distribution analogous to one generated by a normal base current and the transistor thereafter operates in its normal manner.

Figure 5:
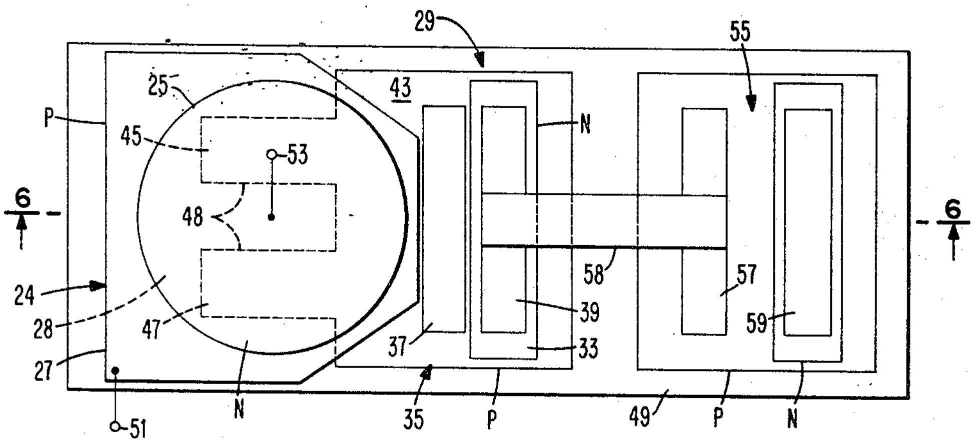
FIG. 5 is a plan view of the device shown in FIG. 4.
Figure 6:
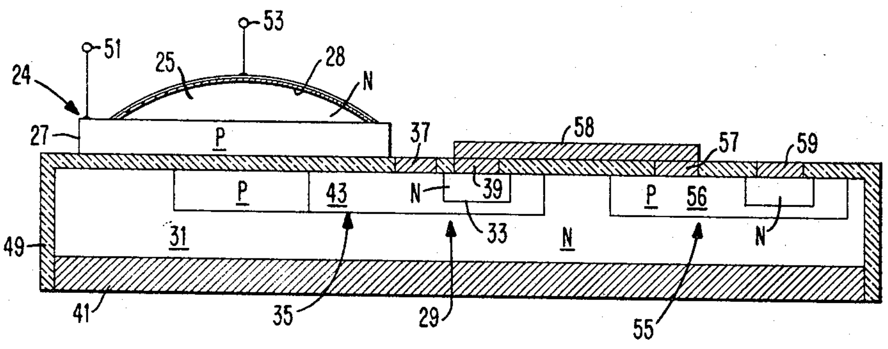
FIG. 6 is a section taken along line 6—6 in FIG. 5.

A second embodiment of the invention is shown in FIGS. 4, 5 and 6. This embodiment employs a two stage integrated transistor circuit in combination with the light generating diode 24. The same numerical designations are employed in FIGS. 4, 5 and 6 as were used in FIGS. 1, 2 and 3 for corresponding elements. Additionally, a second transistor 55 is constructed in a similar manner to the transistor 29 shown in FIG. 3, and need not be described again in complete detail. It should be sufficient that the transistor 55 amplifies the signal generated in the transistor 29 prior to its use to control the passage of current through an associated load. Additionally, the base region 56 of the transistor 55 is equipped with a metallic contact 57 and is connected to the emitter portion 33 of the transistor 29 by the contact 57, a metallic lead 58 and the contact 39. In this second embodiment the load is connected across the emitter output terminal 59 and the collector 31.

While the invention has been particularly shown and described with reference to preferred embodiments thereof, it will be understood by those skilled in the art that various changes in form and details may be made therein without departing from the spirit and scope of the invention.

What is claimed is:

1. An electro-optical device, comprising, a transistor amplifier operating in its low-conducting state and having base, emitter and collector regions, said base region acting as a photon detector over an energy absorption band or frequency absorption spectrum, output contacts electrically connected to said collector and emitter regions, a light emitting semiconductor diode having an energy radiation band or frequency radiation spectrum overlapping with said energy absorption band or frequency absorption spectrum and having P-type, and N-type regions, input contacts electrically connected to said P-type and N-type regions, and means for providing a forward biasing signal to said input contacts, said P-type region being placed in proximity to said base region of said transistor, whereby upon the application of said forward biasing signal to said input contacts said diode emits light, thereby irradiating said base region with photon energy and setting up a charge distribution therein by absorption of said photons and causing said transistor conduction to increase and to amplify said forward biasing signal.

2. In a transistor current switching circuit, an electro-optical switch, comprising, a transistor amplifier biased in a low-conducting configuration and equipped with an emitter circuit, a collector circuit and an exposed base region, said base region acting as a photon detector over an energy absorption band or frequency absorption spectrum, a load in said collector circuit, a light emitting semiconductor diode positioned to irradiate said exposed base region with photons having an energy radiation band or frequency radiation spectrum overlapping with said energy absorption band or frequency absorption spectrum, and means for forward biasing said diode, whereby said forward biasing signal applied to said diode causes said diode to emit light and radiate photo energy upon said exposed base to generate a base current and to increase said transistor conduction wherein current is driven through said associated load.

3. An electro-optical device, comprising, a transistor having base, emitter and collector regions, said base region being silicon having a photon absorption energy band with a lower absorption level of $E_1$ ev., a light emitting semiconductor having a P-type portion and an N-type portion, said P-type portion and said base region, and a radiation energy band with a central radiation level of $E_2$ ev., a silicon oxide layer interposed between and bonded to said P-type portion and said base region, and said $E_2$ radiation level being higher than said $E_1$ absorption level.

4. An electro-optical device, comprising, a planar transistor having integral base, emitter and collector regions, said base region comprising a rectangular shaped main member and a pair of integral rectangular shaped side members extending out from said main member for providing a prolongated light absorption junction with said collector region, said junction acting as a photon detector over an energy absorption band or frequency absorption spectrum, a light emitting semiconductor diode having an energy radiation band or frequency radiation spectrum overlapping with said energy absorption band or frequency absorption spectrum and having a P-type portion and a curvilinear shaped N-type portion, a reflecting layer disposed about said N-type portion, a silicon oxide layer interposed between and bonded to said P-type portion and said base region, whereby said curvilinear shaped N-type portion and said reflecting layer returns the light passing through said N-type portion back onto said base region.

5. A four terminal optical switch with amplifying stages comprising, a first planar transistor biased in a low-conducting configuration and having base, emitter and collector regions, output lines electrically connected to said collector and emitter regions, said base region operating as a photon detector over an energy absorption band or frequency absorption spectrum, a semiconductor diode having a P-type region and an N-type region and operating in its active state as a source of photons with an energy radiation band or frequency radiation spectrum overlapping with said energy absorption band or frequency absorption spectrum, means for operating said diode in its active state, input lines electrically connected to said P-type and N-type regions, a silicon oxide element interposed between and bonded to said P-type region and said base region for transmitting said photons to said base and electrically isolating said input contacts from the remainder of the switch, a second transistor integral with said first transistor and biased in a low-conducting configuration and having base, emitter and collector regions, first means for connecting said base of said second transistor with said emitter of said first transistor, second means for inter-connecting said collectors, and a load connected between said emitter of said second transistor and ground whereby, said load is completely electrically isolated from said input lines.

References Cited

UNITED STATES PATENTS

| | | | |
|---|---|---|---|
| 3,043,958 | 7/1962 | Diemer | 250—211 |
| 3,217,169 | 11/1965 | Grimmeiss et al. | 250—213 X |
| 3,229,104 | 1/1966 | Rutz | 317—234 |
| 3,278,814 | 10/1966 | Rutz | 250—211 X |
| 3,304,429 | 2/1967 | Bonin et al. | 250—217 |
| 3,304,431 | 2/1967 | Biard et al. | 250—217 |
| 3,315,176 | 4/1967 | Biard | 250—217 |

OTHER REFERENCES

Yu: Light Actuated Semiconductor Switching Devices, IBM Technical Disclosure Bulletin, vol. 6, No. 4, September 1963.

Gilleo et al.: Optical Coupling, Electronics, November 1963, pp. 23 to 27.

WALTER STOLWEIN, *Primary Examiner.*

U.S. Cl. X.R.

250—211; 317—235